(12) United States Patent
Yasuda et al.

(10) Patent No.: US 7,355,185 B2
(45) Date of Patent: Apr. 8, 2008

(54) SEMICONDUCTOR RADIATION DETECTOR AND PROCESS FOR PRODUCING THE SAME

(75) Inventors: Kazuhito Yasuda, Kani (JP); Madan Niraula, Nagoya (JP)

(73) Assignee: Nagoya Industrial Science Research Institute, Nagoya-shi (JP)

( * ) Notice: Subject to any disclaimer, the term of this patent is extended or adjusted under 35 U.S.C. 154(b) by 0 days.

(21) Appl. No.: 10/580,833

(22) PCT Filed: Nov. 24, 2004

(86) PCT No.: PCT/JP2004/017891

§ 371 (c)(1),
(2), (4) Date: May 26, 2006

(87) PCT Pub. No.: WO2005/053038

PCT Pub. Date: Jun. 9, 2005

(65) Prior Publication Data

US 2007/0090292 A1    Apr. 26, 2007

(30) Foreign Application Priority Data

Nov. 27, 2003   (JP) .............................. 2003-397978

(51) Int. Cl.
*G01T 1/24* (2006.01)
(52) U.S. Cl. ................................................ 250/370.13
(58) Field of Classification Search .......... 250/370.09, 250/370.13, 338.4; 257/E31.058
See application file for complete search history.

(56) References Cited

U.S. PATENT DOCUMENTS

| 5,646,426 A | * | 7/1997 | Cockrum et al. ........... 257/188 |
| 5,989,933 A | * | 11/1999 | Bevan et al. ................. 438/84 |
| 6,618,410 B1 | * | 9/2003 | Fischer et al. ........... 372/45.01 |

OTHER PUBLICATIONS

Nakanishi, Yutaro et al., "Growth and Electronic Properties of Thick CdTe Layers Growth on GaAs by MOVPE", Tehnical Report of IEICE., vol. 103, No. 50, pp. 81-85, 2003.

(Continued)

*Primary Examiner*—David Porta
*Assistant Examiner*—Mark R Gaworecki
(74) *Attorney, Agent, or Firm*—Oblon, Spivak, McClelland, Maier & Neustadt, P.C.

(57) ABSTRACT

A semiconductor radiation detector 10 comprises a Si substrate 11 of an N-ype of low resistance, an arsenic coating layer 12 formed on the Si substrate, and a CdTe growth layer 13 of a P-type of high resistance laminated and formed thereon by the MOVPE method, which is divided into multiple plane elements of a hetero junction structure by means of division grooves 15 extending from the CdTe growth layer surface to the Si substrate. The Si substrate is heated in a hydrogen reducing atmosphere of a high temperature, and its surface is cleaned. On this Si substrate, GaAs powder or GaAs crystals are thermally decomposed, and coated by arsenic molecule to an extent at about one molecular layer, and an arsenic coating layer is thereby formed. On the Si substrate forming the arsenic coating layer, a CdTe growth layer is formed by the MOVPE method to a film thickness of about 0.2 to 0.5 mm in an atmosphere of about 450 to 500 deg. C.

21 Claims, 5 Drawing Sheets

OTHER PUBLICATIONS

Masuda, Yusuke et al., "Arsenic Doping in CdTe Layers Grown by Metalorganic Vapor Phase Epitaxy", Technical Report of IEICE., vol. 101, No. 82, pp. 13-18, 2001.

Yasuda, K. et al., "MOVPE growth of (100) CdZnTe Layers Using DiPZn", Journal of Crystal Growth, vol. 159, pp. 121-125. 1996.

Uchida, Kei et al., "Study on Detectior for Detecting Large Images of Both CdTe-x Ray and Y Ray by Using MOVPE", Dai 64 Kai Extended Abstracts, the Japan Society of Applied Physics, No. 1, p. 245, 2003 (With Partial English Translation).

Wang, Wen-Sheng et al., "(100) or (111) Heterohepitaxy of CdTe Layers on (100) GaAs Substrates by Organometallic Vapor Phase Epitaxy", Materials Chemistry and Physics, vol. 51, pp. 178-181, 1997.

Leo, G. et al., "Influence of a ZnTe Buffer Layer on the Structural Quality of CdTe Epilayers Grown on (100) GaAs by Metalorganic Vapor Phase Epitaxy", J.Vac.Technol.B., vol. 14, No. 3, pp. 1739-1744, 1996.

* cited by examiner large area having homogeneous and excellent electrical characteristics, and usually a single element of a small volume of about 1×1×1 mm³ has been used or scores
SEMICONDUCTOR RADIATION DETECTOR AND PROCESS FOR PRODUCING THE SAME

TECHNICAL FIELD

The invention relates to a semiconductor radiation detector used in equipment such as medical radiation diagnostic apparatuses, industrial X-ray inspection instruments, and physiological X-ray analyzers, and a method of manufacturing the same.

BACKGROUND ART

In this kind of semiconductor radiation detector, hitherto, high resistance bulk crystals such as cadmium telluride (CdTe) or cadmium zinc telluride (CdZnTe), excellent as radiation detecting materials have been used. In the case of high resistance bulk crystals of CdTe, it is hard to obtain crystals over a large area having homogeneous and excellent electrical characteristics, and usually a single element of a small volume of about $1\times1\times1$ mm$^3$ has been used or scores of them are arranged, and a radiation detector of a small array type is used. When such bulk crystals are used, it is technically difficult to realize a radiation detector for an area large enough to cover the entire chest area of a human body, and it is also very expensive. Further, in the case of radiation detectors based on conventional high resistance bulk crystals of CdTe, conductive electrodes or Schottky electrodes are formed on the upper sides and undersides of the crystals, a high voltage of hundreds to 1000 V is applied between the two electrodes, and the carrier generated by radiation in the CdTe crystals is extracted by an electric field and detected as an electrical signal. Therefore, in this kind of radiation detector using high resistance bulk crystals of CdTe, it is scarcely possible to improve detection characteristics except in terms of the resistance of the element.

In contrast, Japanese Patent Application Laid-Open No. 64-89471 discloses a semiconductor radiation detector having a hetero junction made up of a compound semiconductor crystals of CdTe or the like, and a crystalline thin film of InAs or the like. In the case of this semiconductor radiation detector, the compound semiconductor crystal is used as an active region (active layer) for generating the carrier, and the crystalline thin film layer has a function of implanting the carrier efficiently from the compound semiconductor crystal into the metal electrode. Therefore, if crystal of a II-VI group such as CdTe are used for the compound semiconductor crystal, it is very hard to obtain a crystal covering a large area, and the semiconductor radiation detector becomes very expensive. If on the other hand crystals other than CdTe or CdZnTe are used for the compound semiconductor crystal, radiation-detecting characteristics are not sufficient.

Japanese Patent Application Laid-Open No. 6-120549 discloses a radiation detector composed of semi-insulating semiconductor crystals such as CdTe, a P-type P—HgCdTe epitaxially grown at one of its sides, and an N-type N—HgCdTe epitaxially grown at the other side. In this semiconductor radiation detector, the same problems as in the case of the semiconductor radiation detector disclosed in Japanese Patent Application Laid-Open No. 6-120549 are present because the semi-insulating semiconductor crystals such as CdTe are used as an active region for generating the carrier.

The invention is devised to solve the problems of the prior art, and it is hence an object thereof to present a semiconductor radiation detector excellent in radiation detection performance, having a sufficient strength, capable of being formed over a large area, and manufactured inexpensively; and a method of manufacturing the same.

DISCLOSURE OF THE INVENTION

To achieve the object, a feature of the invention comprises a substrate of Si or GaAs, and a CdTe or CdZnTe growth layer laminated and formed on the surface of the substrate by the metal organic vapor phase epitaxy (MOVPE) method, in which the growth layer is an active layer for incident radiation.

In the invention, since the CdTe or CdZnTe growth layer is laminated by the MOVPE method on the surface of a Si or GaAs substrate having a satisfactory degree of strength, a growth layer having excellent crystallinity is obtained. Hence, by virtue of this growth layer, a favorable radiation detection performance can be obtained. Moreover, since the Si or GaAs substrate can be inexpensively obtained over a large area and with a high degree of strength, and by means of laminating the CdTe or CdZnTe growth layer on its surface by the MOVPE method, a semiconductor radiation detector that is capable of covering a large area, and also of a satisfactory degree of strength, can be obtained inexpensively.

In the invention, the Si or GaAs substrate can be formed as an N-type of low resistance, and the CdTe or CdZnTe growth layer can be formed as a P-type of high resistance. Therefore, in addition to the actions and effects described above, by application of a reverse bias to the semiconductor radiation detector, the carrier generated in the P type active layer as a result of the incidence of radiation can be extracted efficiently by a PN junction.

In the invention, a thin CdTe or CdZnTe intermediate growth layer of an N-type of low resistance can also be provided between the Si or GaAs substrate and the CdTe or CdZnTe growth layer. The thickness of the intermediate growth layer is about 0.02 to 0.05 mm, and thus remains the same hereinafter. By interposing such a thin intermediate growth layer of an N-type of low resistance, damage to the PN junction can be suppressed within the intermediate growth layer, the crystallinity of the CdTe or CdZnTe growth layer can be favorably maintained, and the collection efficiency of carriers generated in the active layer by the PN junction can be enhanced.

In the invention, the Si or GaAs substrate can also be a P-type of low resistance, and the CdTe or CdZnTe growth layer can be formed by laminating the P-type layer of high resistance at the Si or GaAs substrate and the N-type layer of low resistance at the surface side. As a result, in addition to the action and effects described above, by means of applying a reverse bias to the semiconductor radiation detector, the carrier generated in the P type active layer as a result of the incidence of radiation can be extracted efficiently to the PN junction with the N type layer of low resistance.

Further, between the Si or GaAs substrate and the CdTe or CdZnTe growth layer, a thin CdTe or CdZnTe intermediate growth layer of a P-type of low resistance containing arsenic can be provided. As a result, defects occurring at the boundary of the Si substrate can be suppressed by the thin P-type CdTe growth layer, and the radiation characteristics of a CdTe growth layer of high resistance can be enhanced.

Instead of the N-type layer on the surface side, a Schottky electrode may be provided. Hence, by means of a Schottky junction between the Schottky electrode and the P-type layer, the carrier generated in the active layer of a P-type as a result of the incidence of radiation can be extracted efficiently.

In the semiconductor radiation detector, preferably, grooves extending from growth layer on the surface side to the Si or GaAs substrate are provided by cutting means, so as to be separated into multiple unit elements in a two-dimensional arrangement. Means of cutting includes laser cutting, dry etching, and dicing. Thus, a semiconductor radiation detector capable of extending over a large area, and composed of multiple unit elements in a two-dimensional arrangement, can be realized easily.

Further, multiple surface electrodes or Schottky electrodes can be provided on the surface side growth layer of the semiconductor radiation detector, and guard ring electrodes can be provided so as to surround the surface electrodes or Schottky electrodes. As a result, even if the elements are not divided by the formation of grooves by cutting means at the surface side of semiconductor radiation detector, a semiconductor radiation detector capable of extending over a large area, and composed of multiple elements in a two-dimensional arrangement, can still be easily achieved.

Besides, the low resistance growth layer on the surface side is divided into multiple small regions, and arranged in a two-dimensional layout, and in small regions, or small regions of Schottky electrodes, high voltage may be applied in between a main small region at a specified position and plural peripheral small regions that surround the main small region. Hence, even without dividing elements by means of the formation of grooves by cutting means at the surface side of the semiconductor radiation detector, a semiconductor radiation detector of multiple elements in a two-dimensional arrangement can still be easily realized, merely by electrode processing at the surface side.

In another feature of the invention, a manufacturing method of a semiconductor radiation detector comprising a Si substrate, and a CdTe or CdZnTe growth layer laminated and formed on the surface of the substrate by the MOVPE method, using the growth layer as an active layer for incident radiation, wherin the Si substrate is placed in a high temperature reducing atmosphere, the GaAs powder or the GaAs crystals are decomposed, arsenic is deposited on the Si substrate, and the CdTe or CdZnTe growth layer is laminated and formed on the arsenic-deposited surface of the Si substrate by the MOVPE method.

Thus, with the Si substrate placed in a high temperature reducing atmosphere, by thermally decomposing the GaAs powder, or GaAs crystals, and by depositing arsenic on the Si substrate, arsenic can be deposited on the Si substrate in a divalent form, rather than in a quadrivalent form. Thereafter, when CdTe or CdZnTe is grown on the arsenic-deposited surface of the Si substrate by the MOVPE method, the Si substrate and the CdTe or CdZnTe growth layer can be laminated by means of a strong adhesive force through the divalent arsenic. As a result, in the invention, the CdTe growth layer can be formed on the Si substrate by the MOVPE method, a process that was extremely difficult in the prior art, while at the same time a satisfactory degree of adhesion strength and favorable crystallinity can be assured.

When the Si substrate is an N-type of low resistance, and the CdTe or CdZnTe growth layer is a P-type of high resistance, by means of this manufacturing method, the CdTe or CdZnTe growth layer can be laminated on the Si substrate with a strong adhesive force.

Between the Si substrate and the CdTe or CdZnTe growth layer, a thin CdTe or CdZnTe intermediate layer of an N-type of low resistance may further be provided, and in this case, too, by means of the same manufacturing method, the N-type growth layer of high resistance can be laminated on the Si substrate with a strong adhesive force through the divalent arsenic.

When the Si substrate is a P-type of low resistance, and the CdTe or CdZnTe growth layer is formed by laminating a P-type layer of high resistance at the Si substrate side and an N-type layer of low resistance at the surface side, by means of the same manufacturing method, a P-type layer of high resistance as the CdTe or CdZnTe growth layer can be laminated on a Si substrate of a P-type of low resistance with a strong adhesive force.

Between the Si substrate and the CdTe or CdZnTe growth layer, a thin CdTe or CdZnTe intermediate layer of a P-type of low resistance containing arsenic may further be provided, and in this case, too, by means of the same manufacturing method, the P-type growth layer of low resistance containing arsenic can be laminated on a Si substrate of a P-type of low resistance with a strong adhesive force.

Instead of the N-type layer on the surface side, a Schottky electrode may be provided in the semiconductor radiation detector, and in this case also, by means the same manufacturing method, the CdTe growth layer can be formed with a satisfactory degree of adhesion strength and favorable crystallinity.

Moreover, in the manufacturing method of the semiconductor radiation detector, in which grooves extending from the growth layer side to the Si substrate are provided by cutting means so as to be separated into multiple unit elements in a two-dimensional arrangement, by the same manufacturing method, the CdTe growth layer can be formed with a satisfactory degree of strength of adhesion to the Si substrate, and favorable crystallinity.

Further, in the semiconductor radiation detector in which multiple two-dimensional surface electrodes or Schottky electrodes are provided on the surface of the growth layer side, and guard ring electrodes are provided so as to surround the surface electrodes or Schottky electrodes, by this same manufacturing method, a CdTe growth layer can be formed with a satisfactory degree of adhesion strength and favorable crystallinity assured.

Furthermore, in the semiconductor radiation detector in which the low resistance growth layer on the surface side is divided into multiple small regions, and arranged in a two-dimensional layout, and in small regions or small regions of Schottky electrodes, high voltage is applied both in between a main small region at a specified position and plural peripheral small regions that surround the main small region, by this same manufacturing method, a CdTe growth layer can be formed with a satisfactory degree of adhesion strength and favorable crystallinity assured.

According to the invention, on an inexpensive but nonetheless rigid Si or GaAs substrate, a CdTe or CdZnTe growth layer is laminated by the MOVPE method, and a growth layer of favorable crystallinity is obtained. Accordingly, by means of this growth layer, a favorable radiation detection performance can be achieved. Besides, the Si or GaAs substrate can be obtained inexpensively and rigidly over a large area, and by laminating the surface of the CdTe or CdZnTe growth layer by the MOVPE method, a semiconductor radiation detector that can cover a large area, and has a strong rigidity, can be obtained inexpensively.

Further, in the invention, by depositing divalent arsenic on the Si substrate surface by thermally decomposing GaAs powder or GaAs crystals, the CdTe or CdZnTe growth layer can be laminated on the Si substrate rigidly by the MOVPE method. Therefore, the invention has made it possible to form by the MOVPE method a CdTe growth layer on a Si substrate with a satisfactory degree of adhesion strength, and favorable crystallinity assured, a merit that has proved extremely difficult in the prior art.

BEST MODE FOR CARRYING OUT THE INVENTION

Figure 1:
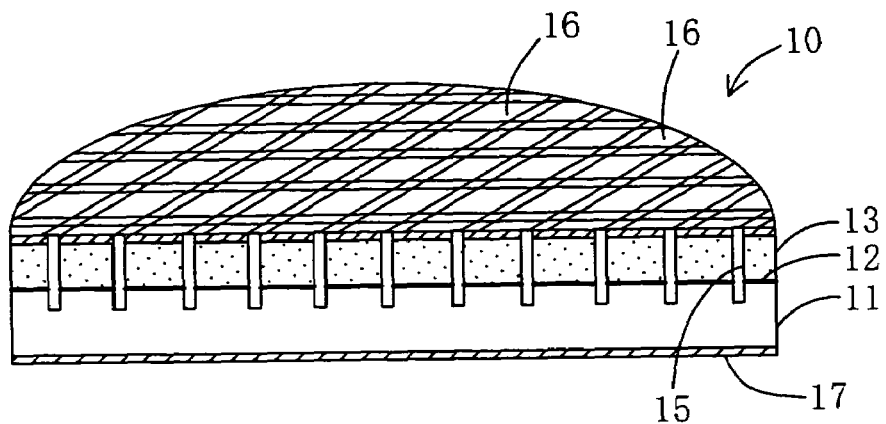
FIG. 1 is a schematic perspective view of a semiconductor radiation detector in a first embodiment of the invention.

An embodiment of the invention is described below with reference to the accompanying drawings. FIG. 1 is a perspective view of the semiconductor radiation detector 10 of a first embodiment, having a CdTe growth layer 13 of a P-type of high resistance laminated and formed by the MOVPE method on a surface of a silicon substrate 11 (Si substrate) of a N-type of low resistance. FIG. 2 represent schematic sectional views of the manufacturing process of the semiconductor radiation detector.

Figure 2A:
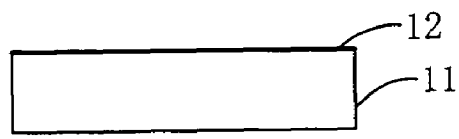
FIG. 2A is a schematic sectional view of part of the manufacturing process of the semiconductor radiation detector.
Figure 2B:
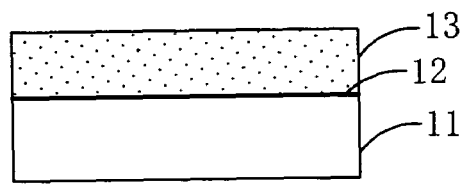
FIG. 2B is a schematic sectional view of part of the manufacturing process of the semiconductor radiation detector.
Figure 2C:
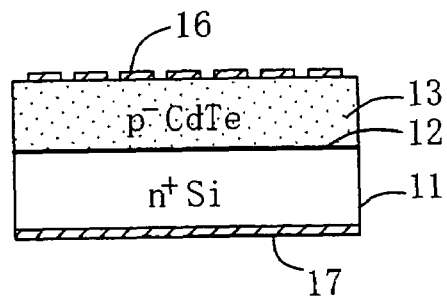
FIG. 2C is a schematic sectional view of part of the manufacturing process of the semiconductor radiation detector.
Figure 2D:
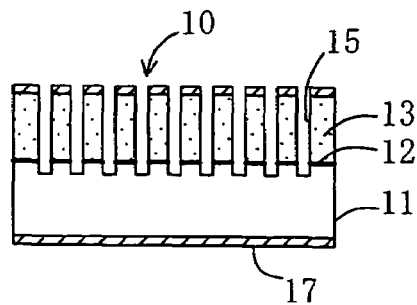
FIG. 2D is a schematic sectional view of part of the manufacturing process of the semiconductor radiation detector.
Figure 2E:
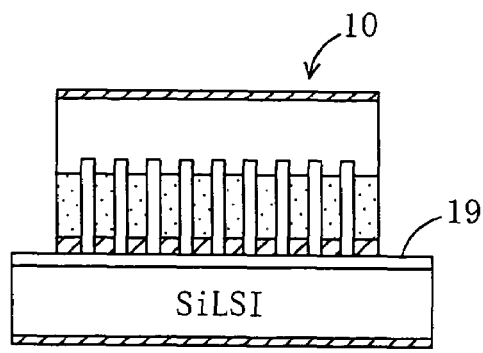
FIG. 2E is a schematic sectional view of part of the manufacturing process of the semiconductor radiation detector.

The semiconductor radiation detector 10 comprises a Si substrate 11 of an N-type of low resistance, an arsenic coating layer 12 formed on the Si substrate 11, and a CdTe growth layer 13 of a P-type of high resistance laminated and formed on the arsenic coating layer by the MOVPE method. By division grooves 15 extending from the surface of the CdTe growth layer 13 as far as the Si substrate 11, the semiconductor radiation detector 10 is divided into multiple elements of a hetero junction structure in a two-dimensional arrangement, and surface side electrodes 16 and underside common electrode 17 of the substrate are provided. The semiconductor radiation detector 10 is as shown in FIG. 2E connected to a semiconductor circuit board 19 on which, for example, a control LSI is mounted by the surface side electrodes 16.

The manufacturing process of the semiconductor radiation detector 10 is explained with reference to FIG. 2.

The direction of the crystal plane is important for the Si substrate in terms of matching with the CdTe growth layer 13. Crystal plane (211) is most preferable, and crystal plane (100) is also favorable. Other crystal planes are also usable. A Si substrate 11 may be formed in a large diameter of about 12 inches, and thus is also sufficient in terms of strength and ease of handling. Hence, use of the Si substrate 11 makes it possible for a semiconductor radiation detector covering a very wide area to be manufactured. This Si substrate 11 is heated in a hydrogen reducing atmosphere of 900 to 1000 deg. C., and the surface is cleaned. On this Si substrate 11, a gallium arsenic (GaAs) powder or GaAs crystals are deposited by thermally decomposing in an atmosphere of 700 to 900 deg. C., and an arsenic coating layer 12 can be formed by coating arsenic molecules equivalent to around one molecular layer (see FIG. 2A).

On a Si substrate 11 with an arsenic coating layer 12, a CdTe growth layer 13 is formed by the MOVPE method in an atmosphere of about 450 to 500 deg. C. to a thickness of about 0.2 to 0.5 mm (see FIG. 2B). Dimethyl cadmium can for example be used as the material for the cadmium, and diethyl tellurium as the material for the tellurium. The P type dopant can, for example, be tertiary butyl arsine. In a CdTe growth layer 13 thus formed, since a divalent arsenic coating layer 12 is formed on the Si substrate 11, it is formed as an active layer that is in tight contact with the Si substrate 11.

In order to form on the surface of the CdTe growth layer 13, two-dimensional multiple unit elements of a small area of about 1 mm square, surface side electrodes 16 can be formed by a sputtering method and a lithography method. On the under side of the Si substrate 11, common electrode 17 is formed by sputtering (see FIG. 2C). Electrode materials include Au, Sb—Au, In—Au, W—Au and T-Pt—Au. Further, extending from the surface side of the CdTe growth layer 13 along the electrodes 16 into the Si substrate 11, division grooves 15 can be formed by a laser cutting method (FIG. 2D). As a result, the semiconductor radiation detector 10 can be obtained in a two-dimensional arrangement divided into multiple unit elements. By means of the electrodes 16 the semiconductor radiation detector 10 can be adhered to an electrode wiring board, that is a semiconductor circuit board 19 on which a signal processing large-scale integrated circuit (LSI) has been formed on part.

As explained above, since, in the first embodiment, in the semiconductor radiation detector 10, the CdTe growth layer 13 is laminated by the MOVPE method on the surface of the Si substrate 11 to a satisfactory degree of strength, a growth layer having favorable crystallinity can be obtained. Further by means of the growth layer, a favorable radiation detection performance is acquired. Moreover, in the first embodiment, the Si substrate 11 is placed in a high temperature reducing atmosphere, and the GaAs powder, or the crystals are decomposed to deposit arsenic on the Si substrate 11, so that an arsenic coating layer 12 can be formed in a divalent form, rather than a quadrivalent form. Accordingly, when CdTe is grown on the Si substrate 11 with the arsenic by the MOVPE method, the CdTe growth layer 13 can be laminated on the Si substrate 11 with a strong adhesive force by virtue of an arsenic coating layer 12 of a divalent arsenic. As a result, in the embodiment, the formation of a CdTe growth layer 13 on the Si substrate 11 by the MOVPE method, which proved very difficult in the prior art, can now be achieved by a stable method, with a satisfactory degree of adhesion strength and favorable crystallinity assured.

Moreover, a Si substrate 11 can be obtained over a large area, and with a high degree of rigidity, inexpensively, and by laminating the surface of CdTe or CdZn Te growth layer by means of the MOVPE method, a semiconductor radiation detector covering a large area and with a satisfactory level of strength can be obtained inexpensively. Moreover, with this semiconductor radiation detector 10, by forming by a laser cutting method, grooves 15 extending from the growth layer side to the Si substrate 11 a semiconductor radiation detector covering a large area in a two-dimensional arrangement, and divided into multiple unit elements, can be easily and inexpensively provided.

Next a modified example of the first embodiment will be described.

Figure 3:
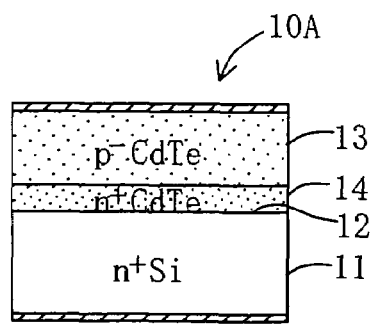
FIG. 3 is a schematic sectional view of the semiconductor radiation detector in a modified example of the first embodiment.

In the semiconductor radiation detector 10 of the modified example, as shown in FIG. 3, an arsenic coating layer 12 is provided on a Si substrate 11 of an N-type of low resistance, a CdTe intermediate layer 14 of an N-type of low resistance is then provided, and further a CdTe growth layer 13 of a P-type of high resistance is formed. A CdTe intermediate layer 14 of an N-type may also be formed by the MOVPE method, like the CdTe growth layer 13 of a P-type, by changing the dopant to iodine. The thickness of the CdTe intermediate layer 14 of an N-type is very thin, from about 0.02 to 0.05 mm, and the CdTe growth layer 13 of a P-type is identical to that in the first embodiment. Thus, according to modified example 1, by forming a thin CdTe intermediate layer 14 of an N-type of low resistance, damage in the PN junction can be suppressed in the intermediate layer 14, crystallinity of the CdTe growth layer 13 can be favorably maintained, and this is effective in terms of enhancing the collection efficiency of carriers generated by the PN junction in the CdTe growth layer 13.

A second embodiment will next be described.

Figure 4:
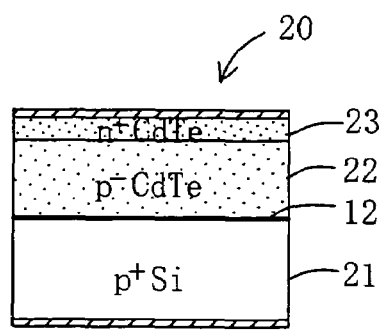
FIG. 4 is a schematic sectional view of the semiconductor radiation detector in a second embodiment.

A semiconductor radiation detector 20 in the second embodiment is shown in FIG. 4, in which an arsenic coating layer 12 is provided on a Si substrate 21 of a P-type of low resistance, and a CdTe growth layer 22 of a P-type of high resistance is provided thereon, and then a CdTe growth layer 23 of an N-type of low resistance is provided. The CdTe growth layer 23 can be similarly formed by the MOVPE method, by changing the dopant to iodine, in the same way as described above. The thickness of the CdTe growth layer 22 of a P-type is similar to that of CdTe growth layer 13. The thickness of the CdTe growth layer 23 of an N-type has a thinness of about 0.02 to 0.05 mm.

According to this embodiment, in addition to the action and effects of the first embodiment, by applying reverse bias to the semiconductor radiation detector 20, carriers generated by the active layer, a CdTe growth layer 22 of a P-type, by means of the incidence of radiation, can be effectively extracted by a PN junction with a growth layer 23 of an N-type of low resistance. In the second embodiment 2, in the same manner as in the first embodiment, a semiconductor radiation detector covering a large area, and with a satisfactory level of strength, can be obtained inexpensively.

A modified example 1 of the second embodiment will now be explained.

Figure 5:
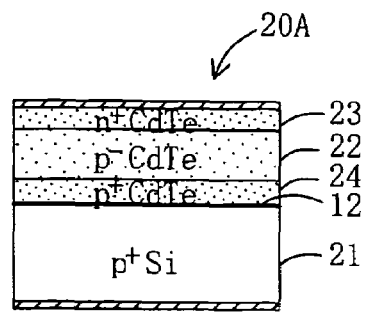
FIG. 5 is a schematic sectional view of the semiconductor radiation detector in a modified example 1 of the second embodiment.

A semiconductor radiation detector 20A of a modified example 1 is shown in FIG. 5. In this modified example an arsenic coating layer 12 is provided on a Si substrate 21 of a P-type of low resistance, a CdTe growth layer 24 of a P-type of low resistance is provided thereon, and then a CdTe growth layer 22 of a P-type of high resistance is provided thereon, and then a CdTe growth layer 23 of an N-type of low resistance is provided. The CdTe growth layers 23, 24 can both be similarly formed by the MOVPE method by changing the dopant to iodine and arsenic, in the same way as described above. The thickness of the CdTe growth layer 22 of a P-type and of the CdTe growth layer 23 of an N-type is similar to those of CdTe growth layers 22, 23 of the second embodiment. The CdTe growth layer 24 of a P-type is a thin layer, of a thickness of about 0.02 to 0.05 mm. Accordingly, in modified example 1, in addition to the action and effects of the second embodiment, defects occurring on the boundary of the Si substrate 21 can be suppressed by the thin CdTe growth layer 24 of a P-type, and the radiation resistance characteristics of the CdTe growth layer 22 of high resistance can be enhanced.

A modified example 2 of the second embodiment will now be explained.

Figure 6:
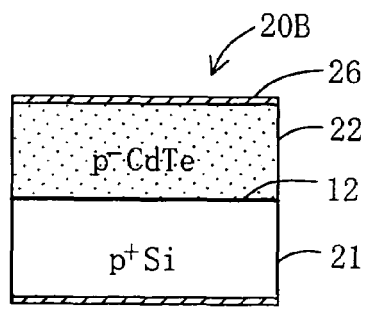
FIG. 6 is a schematic sectional view of the semiconductor radiation detector in a modified example 2 of the same.

A semiconductor radiation detector 20B of a modified example 2 is shown in FIG. 6. In this modified example, instead of the CdTe growth layer 23 of an N-type of low resistance in the semiconductor radiation detector 20 of the second embodiment, a Schottky electrode 26 is provided. The material of the Schottky electrode 26 can, for example, be a gold material. As a result, in the same manner as in the PN junction of the second embodiment, by means of a Schottky junction of the Schottky electrode 26 and the CdTe growth layer 22, carriers generated in the active layer of the CdTe growth layer 22 by means of the incidence of radiation can be extracted efficiently. Moreover, by using a Schottky electrode, instead of the CdTe growth layer 23 of an N-type of low resistance in the semiconductor radiation detector 20A of modified example 1, similar effects can be obtained.

A third embodiment will next be described.

Figure 7:
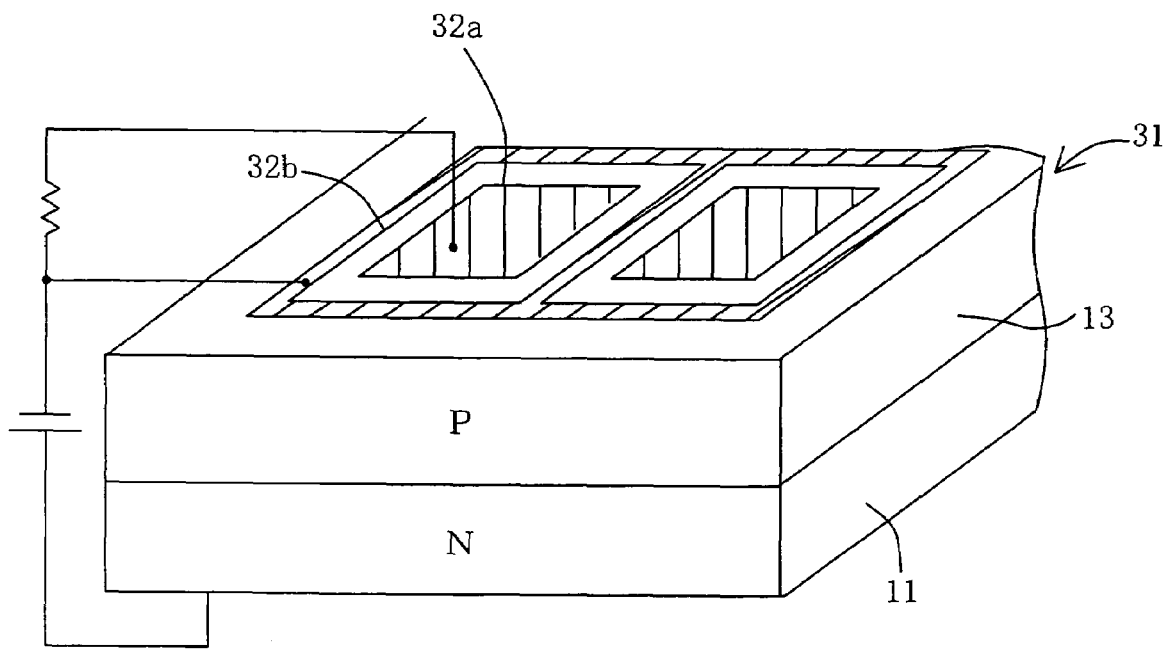
FIG. 7 is a schematic perspective view of the semiconductor radiation detector in a third embodiment.

A semiconductor radiation detector 31 of the third embodiment is shown in FIG. 7. In this embodiment multiple surface electrodes 32a in a two-dimensional arrangement are provided at the surface side of the semiconductor radiation detector, and guard ring electrodes 32b are provided so as to surround the surface electrodes 32a. In other words, instead of forming division grooves 15 at the surface side of the Cdte growth layer 13 extending as far as the inside of Si substrate 11, as described in the first embodiment, the semiconductor radiation detector 31 is divided into multiple unit elements by guard ring electrodes 32b. As a result, the task of forming grooves at the surface side of semiconductor radiation detector 31 can be dispensed with, and a semiconductor radiation detector 31 composed of multiple two-dimensional elements can still be presented inexpensively.

A fourth embodiment will next be described.

Figure 8:
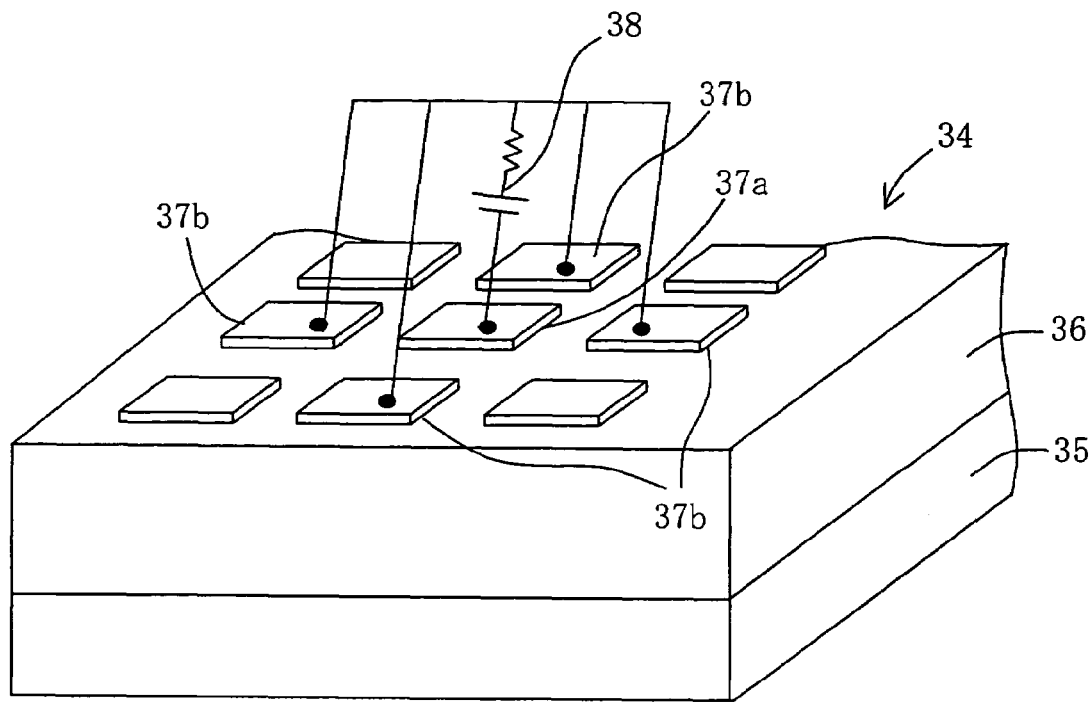
FIG. 8 is a schematic perspective view of the semiconductor radiation detector in a fourth embodiment.

A semiconductor radiation detector 34 of the fourth embodiment is shown in FIG. 8. In this embodiment a CdTe growth layer 36 of high resistance is formed on a Si substrate 35 (or GaAs substrate) of high resistance, and two-dimensional multiple Schottky electrodes 37 are provided on the surface of the growth layer 36. The electrodes 37 are divided into a main electrode 37a at a specified position, and peripheral electrodes 37b surrounding the main electrode. When voltage of a high voltage source 38 is applied between the main electrode 37*a* and the peripheral electrodes 37*b*, carriers generated in the growth layer 36 are processed only at the surface side of the semiconductor radiation detector 34. Hence, in the fourth embodiment, without having to divide the elements by forming grooves on the surface side of the semiconductor radiation detector 34 by a method such as laser cutting, and merely by electrode processing at the surface side, a semiconductor radiation detector of multiple two-dimensional elements can be easily realized.

A fifth embodiment will next be described.

Figure 9:
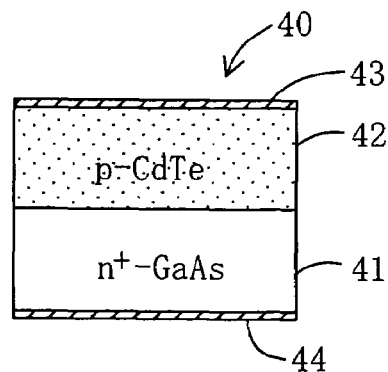
FIG. 9 is a schematic perspective view of the semiconductor radiation detector in a fifth embodiment.

A semiconductor radiation detector 40 of the fifth embodiment comprises, as shown in FIG. 9, a GaAs substrate 41 of an N-type of low resistance, and a CdTe growth layer 42 of a P-type of high resistance laminated and formed on the substrate 41 by the MOVPE method. In this semiconductor radiation detector 40 surface side electrodes 43 and substrate reverse side common electrodes 44 are formed in a state of division by division grooves (not shown) into multiple plane elements of a hetero junction structure extending from the surface of the CdTe growth layer 42 as far as substrate 41.

The GaAs substrate 41 is smaller in diameter than the Si substrate, but can be about 4 inches in diameter, at satisfactory strength and easy to handle. A semiconductor radiation detector capable of covering large area can therefore be manufactured. The GaAs substrate 41 can assure junction strength of the CdTe growth layer 42 without arsenic treatment on the surface unlike the Si substrate 11. As a result, in the fifth embodiment, since the CdTe growth layer 42 is laminated by means of the MOVPE method on the surface of GaAs substrate 41 to a satisfactory degree of strength, an active layer with a satisfactory crystallinity can be obtained. A satisfactory radiation detection capacity can thus be obtained by means of the CdTe growth layer. Further, a GaAs substrate 41 capable of covering large area, and of satisfactory degree of strength can be obtained inexpensively, and by laminating the CdTe growth layer 42 on its surface, a semiconductor radiation detector capable of covering a large area and of a sufficient degree of strength, can be obtained inexpensively.

A modified example 1 of the fifth embodiment will now be explained.

Figure 10:
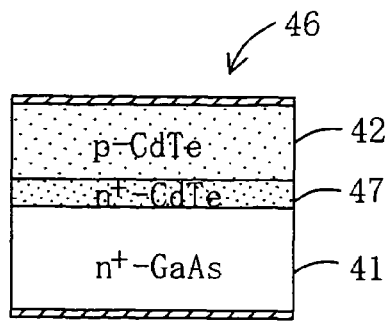
FIG. 10 is a schematic sectional view of the semiconductor radiation detector in a modified example 1 of the fifth embodiment.

A semiconductor radiation detector 46 of a modified example 1 is shown in FIG. 10. In this modified example a thin CdTe intermediate growth layer 47 of an N-type of low resistance is provided between the GaAs substrate 41 of an N-type of low resistance and a CdTe growth layer 42 of a P-type of high resistance laminated and formed by means of the MOVPE method on the substrate 41, already described above in the semiconductor radiation detector 40 of the fifth embodiment. According to modified example 1, in addition to the action and effects of the fifth embodiment, since a thin intermediate growth layer 47 of an N-type of low resistance is provided, damage at the PN junction can be suppressed, and carriers generated in the active layer of the CdTe growth layer 42 by the PN junction can be collected efficiently.

A modified example 2 of the fifth embodiment will now be explained.

Figure 11:
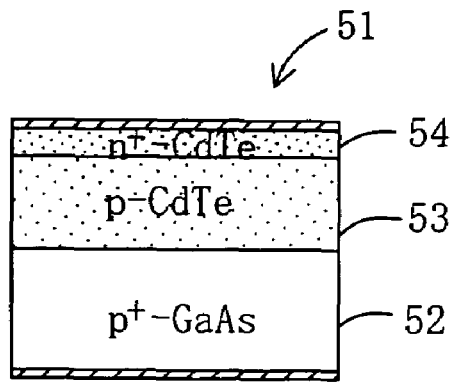
FIG. 11 is a schematic sectional view of the semiconductor radiation detector in a modified example 2 of the same.

A semiconductor radiation detector 51 of modified example 2 is shown in FIG. 11. In this modified example a CdTe growth layer 53 of a P-type of high resistance is provided on a GaAs substrate 52 of a P-type of low resistance, and further a CdTe growth layer 54 of an N-type of low resistance is provided. The CdTe growth layer 54 can be formed by the MOVPE method, by changing the dopant to iodine, in the same manner as described above. According to modified example 2, in addition to the action and effects of the fifth embodiment, by applying reverse bias to the semiconductor radiation detector, carriers generated by the active layer, the CdTe growth layer 53 of a P-type, by means of the incidence of radiation, can be effectively extracted by the PN junction with the growth layer 54 of an N-type of low resistance.

A modified example 3 of the fifth embodiment will now be explained.

Figure 12:
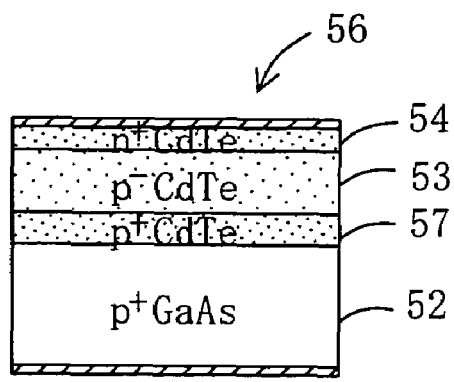
FIG. 12 is a schematic sectional view of the semiconductor radiation detector in a modified example 3 of the same.

A semiconductor radiation detector 56 of modified example 3 is shown in FIG. 12. In this modified example a thin CdTe intermediate growth layer 57 of a P-type of low resistance is provided between the GaAs substrate 52 of a P-type of low resistance and a CdTe growth layer 53 of a P-type of high resistance, already described above in the semiconductor radiation detector 51 of modified example 2. Accordingly, in modified example 3, in addition to the action and effects of the fifth embodiment, defects occurring in the boundary of the GaAs substrate 52 can be suppressed by the thin CdTe intermediate growth layer 57 of a P-type, and the radiation resistance characteristics of the CdTe growth layer 53 of high resistance can be enhanced.

A modified example 4 of the fifth embodiment is explained.

Figure 13:
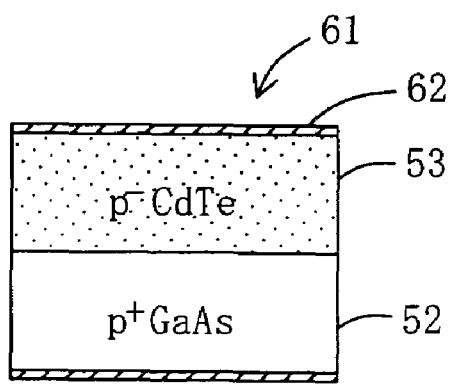
FIG. 13 is a schematic sectional view of the semiconductor radiation detector in a modified example 4 of the same.

A semiconductor radiation detector 61 of modified example 4 is shown in FIG. 13. In this modified example, instead of the CdTe growth layer 54 of an N-type of low resistance in the semiconductor radiation detector 51 of the fifth embodiment, a Schottky electrode 62 is provided. In the same manner as in the PN junction of the second embodiment, by means of the Schottky junction of the Schottky electrode 62 and the CdTe growth layer 53 of a P-type, carriers generated in the active layer, the P-type layer 53, by means of the incidence of radiation, can be efficiently extracted. In the semiconductor radiation detector 56 of modified example 3, even when the Schottky electrode is used instead of the CdTe growth layer 54 of an N-type of low resistance, similar effects can still be obtained.

In the semiconductor radiation detectors of the fifth embodiment and its modified examples, instead of forming a two-dimensional arrangement, by dividing into unit elements by means of division grooves, the methods of the third embodiment or fourth embodiment may be applied. In the embodiments and modified examples, the CdTe growth layer is formed by the MOVPE method, but a CdZnTe growth layer may be formed instead. Furthermore, the semiconductor radiation detectors of the embodiments are only examples, and may changed and modified in various forms without departing from the scope of the true sprit of the invention.

INDUSTRIAL APPLICABILITY

The semiconductor radiation detector of the invention is formed by laminating and forming a CdTe or CdZnTe growth layer on the surface of a Si or GaAs substrate by means of the MOVPE method, a growth layer with favorable crystallinity can be obtained, an excellent radiation detection performance can be obtained inexpensively, a large area can be covered and a satisfactory degree of strength can be provided. In the invention, by thermally decomposing GaAs powder or GaAs crystals, and by depositing divalent arsenic on the surface of the Si substrate, a CdTe or CdZnTe growth layer can be firmly laminated on the Si substrate by means of the MOVPE method, a merit that has been very elusive in the prior art, and thereby outstanding effects can be achieved.

The invention claimed is:

1. A semiconductor radiation detector comprising a substrate of Si or GaAs, and a CdTe or CdZnTe growth layer laminated and formed on a surface of the substrate by the MOVPE method, wherein
   the growth layer is an active layer for incident radiation,
   the Si or GaAs substrate is an N-type of low resistance,
   the CdTe or CdZnTe growth layer is a P-type of high resistance, and
   a thin CdTe or CdZnTe intermediate growth layer of an N-type of low resistance is provided between the Si or GaAs substrate and the CdTe or CdZnTe growth layer.

2. The semiconductor radiation detector of claim 1, wherein grooves extending from a surface side of the growth layer to the Si or GaAs substrate are provided by cutting means, resulting in the semiconductor radiation detector being separated into multiple unit elements in a two-dimensional arrangement.

3. The semiconductor radiation detector of claim 1, wherein multiple surface electrodes or Schottky electrodes are provided on the surface side of the growth layer of the semiconductor radiation detector, and guard ring electrodes are provided so as to surround the surface electrodes or Schottky electrodes.

4. The semiconductor radiation detector of claim 1, wherein the low resistance growth layer at the surface side is divided into multiple small regions, and arranged in a two-dimensional layout, and in the small regions, or in small regions of Schottky electrodes, high voltage is applied in between a main small region at a specified position and plural peripheral small regions that surround the main small region.

5. A semiconductor radiation detector comprising a substrate of Si or GaAs, and a CdTe or CdZnTe growth layer laminated and formed on a surface of the substrate by the MOVPE method, wherein
   the growth layer is an active layer for incident radiation,
   the Si or GaAs substrate is a P-type of low resistance, and
   the CdTe or CdZnTe growth layer is formed by laminating a P-type layer of high resistance at a Si or GaAs substrate side and an N-type layer of low resistance at a surface side.

6. The semiconductor radiation detector of claim 5, wherein between the Si or GaAs substrate and the CdTe or CdZnTe growth layer, a thin CdTe or CdZnTe intermediate growth layer of a P-type of low resistance containing arsenic is provided.

7. The semiconductor radiation detector of claim 6, wherein instead of the N-type layer at the surface side of the CdTe or CdZnTe growth layer, a Schottky electrode is provided.

8. The semiconductor radiation detector of claim 5, wherein instead of the N-type layer at the surface side of the CdTe or CdZnTe growth layer, a Schottky electrode is provided.

9. The semiconductor radiation detector of claim 5, wherein grooves extending from the surface side of the growth layer to the Si or GaAs substrate are provided by cutting means, resulting in the semiconductor radiation detector being separated into multiple unit elements in a two-dimensional arrangement.

10. The semiconductor radiation detector of claim 5, wherein multiple surface electrodes or Schottky electrodes are provided on the surface side of the growth layer of the semiconductor radiation detector, and guard ring electrodes are provided so as to surround the surface electrodes or Schottky electrodes.

11. The semiconductor radiation detector of claim 5, wherein the low resistance growth layer at the surface side is divided into multiple small regions, and arranged in a two-dimensional layout, and in the small regions, or in small regions of Schottky electrodes, high voltage is applied in between a main small region at a specified position and plural peripheral small regions that surround the main small region.

12. A manufacturing method of a semiconductor radiation detector comprising the following steps:
   a Si substrate is placed in a high temperature reducing atmosphere,
   a GaAs powder or GaAs crystals are decomposed,
   arsenic is deposited on the Si substrate, and
   a CdTe or CdZnTe growth layer is laminated and formed on the arsenic-deposited surface of the Si substrate.

13. The manufacturing method of the semiconductor radiation detector of claim 12, wherein the Si substrate is an N-type of low resistance, and the CdTe or CdZnTe growth layer is a P-type of high resistance.

14. The manufacturing method of the semiconductor radiation detector of claim 13, wherein between the Si substrate and the CdTe or CdZnTe growth layer, a thin CdTe or CdZnTe intermediate layer of an N-type of low resistance is provided.

15. The manufacturing method of the semiconductor radiation detector of claim 12, wherein the Si substrate is a P-type of low resistance, and the CdTe or CdZnTe growth layer is formed by laminating a P-type layer of high resistance at the Si substrate side and an N-type layer of low resistance at the surface side.

16. The manufacturing method of the semiconductor radiation detector of claim 15, wherein between the Si substrate and the CdTe or CdZnTe growth layer, a thin CdTe or CdZnTe intermediate layer of a P-type of low resistance containing arsenic is provided.

17. The manufacturing method of the semiconductor radiation detector of claim 16, wherein instead of the N type layer at the surface side of the CdTe or CdZnTe growth layer, a Schottky electrode is provided.

18. The manufacturing method of the semiconductor radiation detector of claim 15, wherein instead of the N type layer at the surface side of the CdTe or CdZnTe growth layer, a Schottky electrode is provided.

19. The manufacturing method of the semiconductor radiation detector of claim 12, wherein grooves extending from a surface side of the growth layer to the Si substrate are provided by cutting means, resulting in the semiconductor radiation detector being separated into multiple unit elements in a two-dimensional arrangement.

20. The manufacturing method of the semiconductor radiation detector of claim 12, wherein multiple surface electrodes or Schottky electrodes are provided on the surface side of the growth layer of the semiconductor radiation detector, and guard ring electrodes are provided so as to surround the surface electrodes or Schottky electrodes.

21. The manufacturing method of the semiconductor radiation detector of claim 12, wherein the low resistance growth layer at the surface side is divided into multiple small regions, and arranged in a two-dimensional layout, and in the small regions, or in small regions of Schottky electrodes, high voltage is applied in between a main small region at a specified position and plural peripheral small regions that surround the main small region.

* * * * *